United States Patent
Jones et al.

(10) Patent No.: US 10,180,995 B2
(45) Date of Patent: Jan. 15, 2019

(54) SYSTEM AND METHOD FOR ASSESSING CUMULATIVE EFFECTS OF A FAILURE

(71) Applicant: The Boeing Company, Chicago, IL (US)

(72) Inventors: David H. Jones, Bellevue, WA (US); Tyler J. Petri, Seattle, WA (US); Daniel J. Fogarty, Mukilteo, WA (US); Chad R. Douglas, Shoreline, WA (US); Roger Nicholson, Everett, WA (US); Lars Fucke, Madrid (ES); Stephen Sweeney, Madrid (ES); Ricardo M. Fricks, Lake Stevens, WA (US); Kevin Nicholas King, Mill Creek, WA (US)

(73) Assignee: The Boeing Company, Chicago, IL (US)

( * ) Notice: Subject to any disclaimer, the term of this patent is extended or adjusted under 35 U.S.C. 154(b) by 693 days.

(21) Appl. No.: 13/941,785

(22) Filed: Jul. 15, 2013

(65) Prior Publication Data

US 2015/0019187 A1 Jan. 15, 2015

(51) Int. Cl.
G06G 7/48 (2006.01)
G06F 17/50 (2006.01)
G05B 23/02 (2006.01)

(52) U.S. Cl.
CPC ..... G06F 17/5009 (2013.01); G05B 23/0251 (2013.01); Y02T 10/82 (2013.01)

(58) Field of Classification Search
CPC .................................................. G06F 17/5009

(Continued)

(56) References Cited

U.S. PATENT DOCUMENTS 6,208,955 B1 3/2001 Provan et al.
7,158,958 B2 1/2007 Przytula et al.
(Continued)

FOREIGN PATENT DOCUMENTS

EP 1857941 A2 11/2007
JP 2006343063 A 12/2006

OTHER PUBLICATIONS

European Communication for Application No. 14 176 673.3 dated Jan. 30, 2015, 9 pp.
(Continued)

*Primary Examiner* — Hugh M Jones
(74) *Attorney, Agent, or Firm* — Womble Bond Dickinson (US) LLP

(57) ABSTRACT

A failure-effect validation system includes an effects modeler configured to develop a cumulative effects model for failure modes of the complex system, and by which a model of the complex system is extendible to form an extended complex-system model. The effects modeler is also configured to develop search targets each of which includes logical expressions of notable hazards and other factors that contribute to the cumulative effects, such as crew workload, safety margin and/or physiological effects. A model analysis system is configured to perform an automated analysis using the extended complex-system model and search targets, and in which the automated analysis includes a graph search of possible states of the extended complex-system model to locate search targets. And the effects assessment system is configured to selectively generate a layout of failure analysis data including at least a portion of the extended complex-system model and results of the automated analysis.

8 Claims, 8 Drawing Sheets

(58) Field of Classification Search
USPC .............................................................. 703/6
See application file for complete search history.

(56) References Cited

U.S. PATENT DOCUMENTS

| | | | |
|---|---|---|---|
| 7,770,052 | B2 | 8/2010 | King et al. |
| 2006/0064291 | A1 | 3/2006 | Pattipatti et al. |
| 2008/0297375 | A1 | 12/2008 | Khuzadi |
| 2009/0216393 | A1 | 8/2009 | Schimert |

OTHER PUBLICATIONS

Bozzano et al., "ESACS: an integrated methodology for design and safety analysis of complex systems," Copyright 2003, European Safety and Reliability 2003, 8 pages.

Bozzano et al., "Safety, Dependability and Performance Analysis of Extended AADL Models," Copyright 2010, The Computer Journal, vol. 54 No. 5, 2011, 22 pages.

Bretschneider et al., "Model-Based Safety Analysis of a Flap Control System," Managing Complexity and Change!, INCOSE 2004—14th Annual International Symposium Proceedings—11 pages.

"Considering Cumulative Effects Under the National Environmental Policy Act," Council on Environmental Quality Executive Office of the President, Jan. 1997, 61 pages.

"Failure mode and effects analysis," Copyright 2013, Wikipedia article—http://en.wikipedia.org/w/index.php?title=Failure_mode_and_effects_analysis&printable=yes, 6 pages.

"Fault tree analysis," 2013, Wikipedia article—http://en.wikipedia.org/wiki/Fault_tree[May 6, 2013 12:10:02 PM], 8 pages.

Joshi et al., "Model-Based Safety Analysis Final Report," 2006, 55 pages.

Joshi et al., "Model-Based Safety Analysis," Feb. 2006, NASA/CR-2006-213953—Prepared for Langley Research Center under Cooperative Agreement NCC-1-01001, 60 pages.

Merkling, "Seeking Failure-Free Systems," Air University Review, Jul.-Aug. 1976, 6 pages.

Mohr, "Failure Modes and Effects Analysis," Feb. 2002, 8th Edition, Jacobs Sverdrup, 37 pages.

Rauzy, "Model-Based Reliability Engineering: The AltaRica Language," (visited May 6, 2013) www.see.asso.fr/file/1643/download/5872, 24 pages.

Partial European Search Report for Application No. 14176673.3 dated May 18, 2015, 6 pp.

Notice of Reasons for Rejection (English translation) for Patent Application JP2014-112155, dated Apr. 3, 2018, 3 pp.

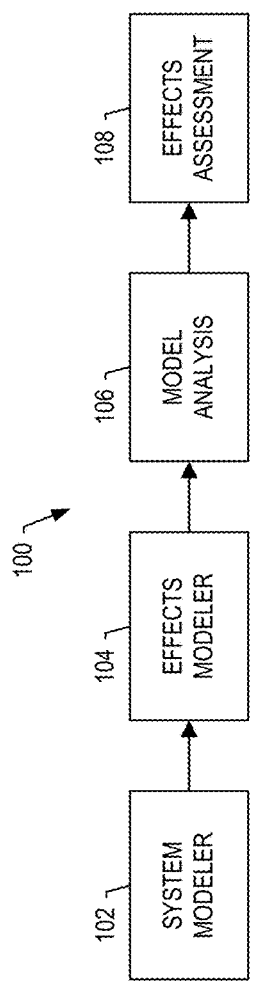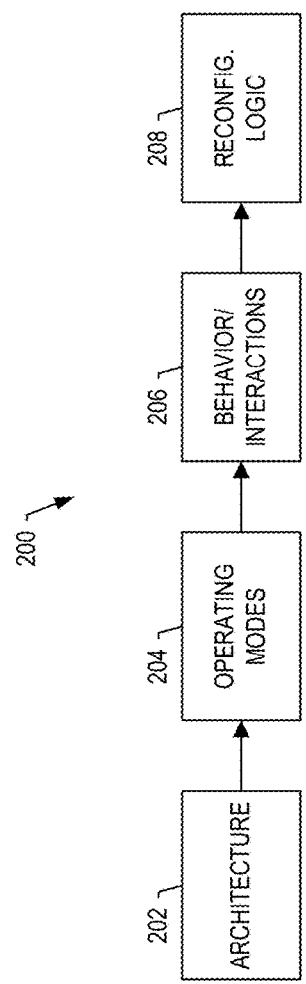

| Failure Case | Structural Integrity | Stability and Control | Operational Awareness | Environmental Control | Power Generation and Distribution | Loading, Maint. And Ground Handling | Control on Ground | Summary |
|---|---|---|---|---|---|---|---|---|
| Failure Case 1<br><br>Loss of System A and Loss of System B | No impact. | Loss of flaps and slats.<br><br>Loss of X spoiler pairs (Y drift over time). | Loss of window heat.<br><br>Loss of flight deck lighting. | Loss of cabin pressure. | High Voltage DC power lost. | Loss of dataload. | Loss of normal landing gear extension.<br><br>Loss of thrust reversers.<br><br>Loss of auto speedbreaks.<br><br>Loss of nose wheel steering. | Alternate landing gear extension.<br><br>Loss of visibility due to loss of window heat and lighting.<br><br>Higher speed landing.<br><br>Overall, there is sufficient functionality & safety margin to land at the nearest suitable airport. |

FIG. 10

SYSTEM AND METHOD FOR ASSESSING CUMULATIVE EFFECTS OF A FAILURE

CROSS-REFERENCE TO RELATED APPLICATION(S)

The present application is related to U.S. patent application Ser. No. 13/524,173, entitled: Failure Analysis Validation and Visualization, filed on Jun. 15, 2012, the content of which is incorporated herein by reference in its entirety.

TECHNOLOGICAL FIELD

The present disclosure relates generally to assessing cumulative effects of system failures and, in particular, to assessing cumulative effects of single and multiple system failures in a highly-automated manner.

BACKGROUND

A complex system such as an aircraft may be generally composed of a number of systems, and enable functionality greater than their individual systems. Technological advances in many complex systems including aircraft and others such as those in the aerospace, automotive, marine, medical and electronics industries have led to numerous mutually-dependent systems, at least some of which may be designed by different teams from different companies in different geographical locations. Failures or malfunctions of one or more of these systems often affect other systems, directly or indirectly, the collection of these effects often referred to as "cascading" effects. Additionally, analysis of these system failures/malfunctions and their cascading effects at the complex-system level is often required as part of a certification process. Typically such analyses are manually performed by groups of system analysts, without reference to a process capable of facilitating such analyses. As complex systems and the systems of which they are composed become more integrated, traditional analysis methods may no longer be practical in terms of breadth of coverage and labor costs involved.

In the aerospace industry, for example, aircraft manufacturers assess the cumulative effects of safety-critical system failures to ensure that equipment operates as intended under all expected operating conditions. Standards established by regulators, such as Code of Federal Regulations (14 CFR) 25.1309, require that the hazard categorization of a failure takes into account all relevant factors. These factors may include effects on the vehicle (lost or degraded function/performance, reduction of safety margin), effects on crew members (increase in workload, adverse operational or environmental conditions), and/or effects on occupants.

There are a number of safety analysis practices in the aerospace industry. For example, functional hazard assessment (FHA) is a top-down analysis of functions to identify and classify the severity of failures of the functions. Fault tree analysis (FTA) is top-down analysis in which the causes of a failure effect are analyzed using logic (e.g., Boolean logic) that combines contributing failures. Failure modes and effects analysis (FMEA) is a bottom-up analysis approach to identify the effects of failures on system functions and operations. FMEA is often used in conjunction with FTA, and can serve to complete and validate the FTA. Model-based safety analysis (MBSA) is an emerging practice in which the system design and safety assessment processes develop a common model that is used to automatically generate a consistent set of safety artifacts, including minimal cut set (MCS) fault trees and FMEA summaries.

Therefore, it may be desirable to have a system and method that improves upon existing practices.

BRIEF SUMMARY

Example implementations of the present disclosure are generally directed to an improved system for assessing cumulative effects of system failures at the complex-system level. The system and method of example implementations may identify and evaluate (or facilitate identification and evaluation of) the cumulative effects of cascading failures, such as those that result in multiple hazards (or failure conditions), and may do so in an efficient, comprehensive and at least partially automated manner. Example implementations may address the growing integration of complex systems such as aircraft, including those with integrated modular avionics (IMA) architectures. Example implementations may reach beyond current practices and standard analysis methods, and automate substantial aspects of the identification and evaluation. Example implementations may further combine and extend state of the art practices in model-based development, model-based safety analysis, automated analysis and generation of visual layouts of the results to facilitate review of analysis results by subject-matter experts (SMEs) such as operators, designers, safety engineers, certification specialists and the like.

According to one aspect of example implementations, a failure-effect validation system is provided for assessing cumulative effects of one or more failures (cascading system failures) of a complex system including or otherwise composed of a plurality of systems. The failure-effect validation system includes an effects modeler and model analysis system coupled to one another. The effects modeler is configured to develop a cumulative effects model for failure modes of the complex system, and by which a model of the complex system is extendible to form an extended (complex-system) model. The effects modeler is also configured to develop one or more search targets each of which includes logical expressions of notable hazards and one or more other factors that contribute to the cumulative effects, such as crew workload, safety margin and/or physiological effects.

The model analysis system is configured to perform an automated analysis including a graph search of possible states of the extended model to locate one or more search targets. The automated analysis may be performed to identify cumulative effects of at least some of the failure modes, and results of which may be displayable in a layout to enable assessment of the cumulative effects. In some examples, the model analysis system may be coupled to an effects assessment system configured to generate the layout. In this regard, the effects assessment system may be configured to selectively generate a layout of failure analysis data including at least a portion of the extended model and results of the automated analysis.

In various examples, the effects modeler includes a hazards modeler and search-target encoder. In these examples, the hazards modeler may be configured to develop a hazards model of complex-system-level and system-level hazards. And the search-target encoder may be configured to develop one or more search targets in which notable hazards are defined as greater than a threshold count of complex-system-level and system-level hazards.

In one example in which the other factors include crew workload, the effects modeler may include a crew-workload modeler configured to develop a model of crew workload in which crew workload is defined to include one or more of a count of alert messages, a count of compensatory actions or pages of compensatory actions, or a time to complete compensatory actions. In this example, a search-target encoder may be configured to develop one or more search targets in which notable crew workload is defined as greater than a threshold count of alert messages, a threshold count of compensatory actions or pages of compensatory actions, or a threshold time to complete compensatory actions.

In a further example, the compensatory actions may include crew procedures and non-normal operating procedures. In this further example, the crew-workload modeler may be configured to develop the model of crew workload in which crew workload is defined to include counts of respective ones of alert messages, crew procedures or pages of crew procedures, and non-normal operating procedures or pages of non-normal operating procedures. And the search-target encoder may be configured to develop one or more search targets in which notable crew workload is defined as the logical disjunction of greater than threshold counts of respective ones of alert messages, crew procedures or pages of crew procedures, and non-normal operating procedures or pages of non-normal operating procedures.

In one example in which the other factors include safety margin, the effects modeler may include a safety-margins modeler configured to develop a model of safety margins in which safety margin is defined to include one or more operational factors and measures of one or more conditions that affect safety margin. In this example, a search-target encoder may be configured to develop one or more search targets in which notable loss of safety margin is defined as greater or less than threshold measures of the one or more conditions.

In one example in which the other factors include physiological effects, the effects modeler may include a physiological-effects modeler configured to develop a model of physiological effects in which physiological effects are defined to include measures of one or more conditions that affect physiological or physical comfort or discomfort. In this example, a search-target encoder may be configured to develop one or more search targets in which notable physiological effects are defined as greater or less than threshold measures of the one or more conditions.

In a further example, the condition(s) include a plurality of conditions including two or more of cabin pressure, temperature, light levels, cabin-visibility levels or breathability. In this further example, the physiological-effects modeler may be configured to develop the model of crew workload in which crew workload is defined to include measures of respective ones of the plurality of conditions. And the search-target encoder may be configured to develop one or more search targets in which notable physiological effects are defined as the logical disjunction of greater or less than threshold measures of respective ones of the plurality of conditions.

In other aspects of example implementations, a method and computer-readable storage medium are provided for assessing cumulative effects of a failure. The features, functions and advantages discussed herein may be achieved independently in various example implementations or may be combined in yet other example implementations further details of which may be seen with reference to the following description and drawings.

BRIEF DESCRIPTION OF THE DRAWING(S)

Having thus described example implementations of the disclosure in general terms, reference will now be made to the accompanying drawings, which are not necessarily drawn to scale, and wherein:

FIG. 1 is an illustration of a cumulative-failure-assessment system in accordance with an example implementation;

FIGS. 2, 3, 4 and 5 illustrate a suitable system modeler, effects modeler, model analysis system and effects assessment system, respectively, according to example implementations of the present disclosure;

FIGS. 7-10 schematically illustrate suitable layout models according to example implementations.

DETAILED DESCRIPTION

Figure 3:
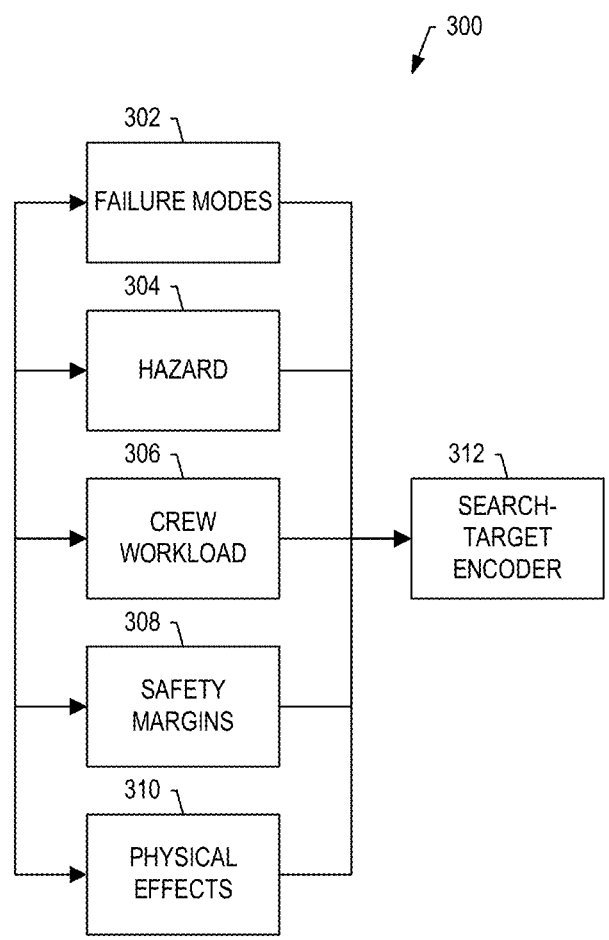

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. Also, something may be shown or described as being above something else (unless otherwise indicated) may instead be below, and vice versa; and similarly, something shown or described as being to the left of something else may instead be to the right, and vice versa. Like reference numerals refer to like elements throughout.

Example implementations of the present disclosure relate generally to assessing cumulative effects of system failures in a complex system and, in particular, to assessing cumulative effects of single and multiple system failures in a highly-integrated complex system in a highly-automated manner. Example implementations will be primarily described in conjunction with aerospace applications in which the complex system may be an aircraft. It should be understood, however, that example implementations may be utilized in conjunction with a variety of other applications, both in the aerospace industry and outside of the aerospace industry (e.g., automotive, marine, electronics). Access to accurate and consistent failure data is important because it can impact multiple aspects of equipment operations, including safety, operations, maintenance, engineering support and the like.

A complex system such as an aircraft may be generally composed of one or more components, subsystems or the like (each generally referred to as a "subsystem"); and each subsystem may be composed of one or more parts, and each part may include one or more features. The parts of the complex system may be assembled into a number of subsystems, which in turn may be assembled into the complex system. In the context of an aircraft, one or more parts or subsystems may be designed as a modular component of the aircraft often referred to as a line-replaceable unit (LRU), of which a single aircraft may include a number of LRUs and other parts or subsystems. Any of the complex system itself or any of its subsystems, parts (of subsystems), features (of parts) or the like may at times be generally referred to as a "system."

As described herein, a system may present a failure condition (sometimes referred to as a hazard) caused by one or more failures. A system may fail in any of a number of different manners such as by malfunction, degradation or failure, each of which may refer to a failure mode (as described herein, reference to a failure may at times equally apply more particularly to a failure mode). In some examples, a failure case or scenario (generally "scenario") may describe a complex-system-level failure, beginning with one or more originating system-level failure effects that lead to a complex-system-level failure condition. A failure effect may refer to the operation of a system as the result of a failure; that is, the consequence(s) that a failure mode has on the operation, function or status of a system. And in some examples, a failure or failure effect may become a failure condition or hazard.

The effects of a system-level failure may include one or more direct effects, and in various instances, one or more indirect effects, each of which may cause an indirect failure. That is, failure of one system and its failure effects may impact another system, which may in turn have its own failure effects. A collection of system failure effects may at times be referred to as "cascading" failure effects. Each cascading effect may be associated with an "order." For example, a first-order failure effect may be immediately associated the failure condition, a second-order failure effect may be associated with a first-order effect, and so-on.

An aircraft, for example, may experience failure of an aircraft electrical bus or navigational system (failure condition). This failure condition may impact other systems that will have their own failure effects (e.g., first-order failure effects), such as hydraulic effects, navigational effects and/or avionics effects, any one or more of which may lead to more cascading effects (e.g., second-order, third-order, etc.). For example, a hydraulic effect may lead to a flight control effect, which in turn may lead to an air frame vibration effect. More generally, then, a failure scenario may describe a system failure beginning with an originating failed system and perhaps also including one or more higher-ordered (e.g., second-ordered, third-ordered) failed systems.

Referring now to FIG. 1, a failure-effect validation system 100 is illustrated according to example implementations of the present disclosure. The system may include any of a number of different subsystems (each an individual system) for performing one or more functions or operations. As shown, for example, the system may include a system modeler 102, effects modeler 104, model analysis system 106 and/or effects assessment system 108. Although shown as part of the failure-effect validation system, one or more of the system modeler, failure modeler, model analysis system and/or effects assessment system may instead be separate from but in communication with the failure-effect validation system. It should also be understood that one or more of the subsystems may function or operate as a separate system without regard to others of the subsystems. And further, it should be understood that the failure-effect validation system may include one or more additional or alternative subsystems than those shown in FIG. 1.

The system modeler 102 of the failure-effect validation system 100 may be generally configured to develop a complex-system-level model of the complex system. The effects modeler 104 may be configured to develop a cumulative effects model for failure modes of the complex system (or its systems), and by which the complex-system-level model may be extended. The cumulative effects model may be composed of various models including those for failure modes, hazards and/or other factors that may contribute to cumulative effects. In some examples, then, the effects modeler may also be configured to develop logical expressions that define notable (or excessive) hazards or other contributing factors based on these models (the logical expressions referred to at times as search targets). The model analysis system 106 may be configured to perform an automated analysis using the extended complex-system model and search targets. The model analysis system may be configured to perform the analysis to identify cumulative effects of at least some of the failure modes. And the effects assessment system 108 may be configured to perform or otherwise enable a complex-system-level assessment of the cumulative effects.

Reference will now be made to FIGS. 2, 3, 4 and 5, which illustrate more particular examples of a suitable system modeler 102, effects modeler 104, model analysis system 106 and effects assessment system 108, respectively, according to example implementations of the present disclosure.

FIG. 2 illustrates a system modeler 200, which in one example implementation may correspond to system modeler 102. The system modeler may be generally configured to develop a complex-system-level model of the complex system, and may include a number of modelers configured to model aspects of the complex system of which the complex-system model may be composed. As shown, for example, the system modeler may include an architecture modeler 202, operating-modes modeler 204, behavior/interactions modeler 206 and/or reconfiguration-logic modeler 208.

The architecture modeler 202 may be configured to develop a model of the architecture of the complex system. In this regard, the architecture modeler may model the complex system's architecture, function, systems, functional flow (e.g., energy, matter, information) and the like. The architecture modeler may model the complex system's safety-critical systems and flows (e.g., energy, matter, information). Further, the architecture modeler may model operator (e.g., pilot) commands, one or more (e.g., major) sensors (e.g., air data) and the like.

The operating-modes modeler 204 may be configured to develop a model of operation modes of the complex system. The operating-modes modeler may model one or more (e.g., major) complex-system-level operating modes, and/or system-level operating modes of various systems such as those visible across system boundaries. In one example, the operating-modes modeler may model operational-dependent behavior, such as flight-phase dependent behavior.

The behavior/interactions modeler 206 may be configured to develop a model of behavior and/or interactions of systems of the complex-system (a behavior/interactions model). That is, behavior/interactions modeler may model system-level behaviors and/or interactions for various systems of the complex system. In some examples, this behavior/interactions model may include logical relationships between systems, and which logical relationships may be reflected by logical interfaces between the respective systems. Logical interfaces between a system and one or more other systems may indicate systems where effects (e.g., actual effect, reduction in redundancy, "no effect," etc.) should be expected in the event of failure of the respective system. Logical interfaces may be provided by appropriate information, such as that provided by an interface control document (ICD). In one example, the behavior/interactions model may include transfer functions (at some level of abstraction). In some examples, the behavior/interactions model may particularly include systems with failure modes that may be safety-critical.

The reconfiguration-logic modeler 208 may be configured to develop a model of complex-system reconfiguration logic. This reconfiguration logic may include, for example, electrical load management (ELM) data, and/or reconfiguration logic visible across system boundaries (e.g., environmental control, hydraulics, flight controls). In one example, ELM data may include electrical load data, which may describe the power state of one or more electrical systems (e.g., powered, not powered, intermittent power) in various operational states of the complex system. In the context of aircraft, in certain operational states (e.g., on ground, power-up, one engine shut down, etc.), an electrical system may be in various power states (e.g., half power, quarter power, etc.). In these situations, certain systems may be powered while other systems may not be powered. The ELM data may therefore indicate which systems are "load shed" (e.g., power removed from some equipment to maintain basic functionality under certain scenarios). In one example, then, the electrical load data may be given in one or more "load shed" lists.

FIG. 3 illustrates an effects modeler 300, which in one example implementation may correspond to effects modeler 104. The effects modeler may be configured to develop a cumulative effects model for failure modes of the complex system, and may include a number of modelers configured to model failure modes, hazards and/or other factors that may contribute to cumulative effects of various failure modes. The effects modeler may also be configured to develop search targets for various failure modes. As shown, for example, the effects modeler may include a failure-modes modeler 302, hazards modeler 304, crew-workload modeler 306, safety-margins modeler 308 and/or physiological-effects modeler 310, which may be coupled to one another as well as to a search-target encoder 312.

The failure-modes modeler 302 may be configured to develop a model of failure modes of the complex system (or its systems). That is, the failure-modes modeler may model the failure modes that the complex system and/or various associated systems may experience. Some examples of suitable failure modes may include the failure-off of a number of systems or operations of respective systems, such as liquid cooling, equipment-bay cooling, air conditioning, electrical buses, pumps, transformer-rectifiers and the like. Other examples of suitable failure modes may include loss or degradation of brakes, failed/slow thrust reverser and the like. For more information regarding aspects of a suitable failure-modes modeler, see U.S. Pat. No. 7,770,052, entitled: Collaborative Web-Based Airplane Level Failure Effects Analysis Tool, issued on Aug. 3, 2010, the content of which is incorporated herein by reference in its entirety.

The hazards modeler 304 may be configured to develop a hazards model of complex-system-level and system-level hazards. The hazards modeler may model hazards that may be presented by the complex system and/or various associated systems, logic according to which the hazards may be presented, and/or failure modes to which the hazards may lead or contribute. In some examples, then, the hazards modeler may model propagated (cascading) failures and effects to which the hazards may lead or contribute. Examples of propagated failures may include loss of satellite communication due to load shed, loss of transceiver due to loss of power to bus, loss of motor controller due to loss of liquid cooling, and the like.

In some examples, complex-system-level or system-level hazards may be expressed in terms of the logic according to which the respective hazards may be presented. In this regard, a hazard may be coded in logic and include complex-system-level model variables, conditional and mathematical operators, and the like. For example, the loss of communications may be defined by the loss of short-range communication and long-range communication functions. In turn, loss of short-range communication may be defined in terms of all redundant satellite communication systems being off or out-of-service. This may be expressed by a set of Boolean expressions specific to the aircraft, such as:

Loss of $Comm := $ loss_short_range_comm & loss_long_range_com;

loss_short_range_comm :=

$(av.SATCOM\text{-}L.\text{state} = \text{off} \ \& \ av.SATCOM\text{-}r.\text{state} = \text{off});$ loss_long_range_comm := $(av.HF\text{-}L.\text{state} = \text{off} \ \& \ av.HF\text{-}R.\text{state} = \text{off}); \ldots$ The hazards modeler 304 may also include a severity (or hazard level) and/or probability for the hazards. In some examples, the severity may indicate the effect of the hazard on occupants and/or operations of the complex system, and the probability may indicate the chance of the hazard occurring. In one example, the hazards, logic, levels and probabilities may be given by a system safety assessment (SSA) and/or functional hazard assessment (FHA). In one example, severity may be numerically represented, such as in order from "one" to "five" in increasing severity. In another example, severity may be given by categories, such as by the following in increasing severity: "no safety effect," "minor," "major," "hazardous" and "catastrophic."

The crew-workload modeler 306, safety-margins modeler 308 and/or physiological-effects modeler 310 may be configured to develop models of respective factors that may contribute to cumulative effects of various failure modes (in addition to hazards or effects to which hazards may lead or contribute). As suggested, these other factors may include workload, safety margins, physiological effects and the like.

The crew-workload modeler 306 may be configured to develop a model of crew workload. In some examples, crew workload may be defined to include a count of alert messages that may be generated in response to a hazard or failure mode. Alert messages may include, for example, alert messages, status messages, maintenance messages or the like that may be generated in response to a failure effect. For example, an alert message may be an actionable crew alert message displayed to flight crew to indicate a lack of adequate cabin pressurization. In one example, alert messages may be prioritized according to an increased need for action, such as "warning," "caution" and "alert."

In response to a hazard or failure mode, the crew may be tasked to take one or more compensatory actions such as crew procedures, non-normal operating procedures and the like, which in some examples may be reflected in one or more checklists, paginated documents or other the like. Examples of suitable compensatory actions may include switch to alternate power, descend aircraft and the like. The time available to complete compensatory actions may be different in different phases of operation, such as cruise or landing for aircraft. In some examples, then, crew workload may be defined to include a count of compensatory actions or pages of compensatory actions, and/or a time to complete compensatory actions, in addition to or in lieu of the count of alert messages. More particularly, for example, crew workload may include a count of (pages of) crew procedures, a count of (pages of) non-normal operating procedures, and/or a time to complete compensatory actions. In some examples, the crew-workload modeler may model human-machine interactions in a more detailed fashion.

The safety-margins modeler 308 may be configured to develop a model of safety margins. Safety margin may be considered the gap between expected usage and an unsafe condition, and may be related to one or more operational factors. Safety margins for aircraft may include, for example, separation between aircraft, between an aircraft and the ground, between an aircraft and weather, aircraft range for combination of fuel and flight factors, obstacle limited runway on takeoff/climb, stopping/steering on a short runway, and the like.

In accordance with example implementations, the safety-margins modeler 308 may model one or more operational factors, such as for a mission, flight-phase or environment of the complex system, any or all of which may interact with or qualify a particular failure condition. Examples of mission include trans-oceanic flight, (no nearby airport) and the like. Examples of flight-phase include taxi, takeoff, climb, cruise, descent, landing, sub-phases and the like. And examples of environment include weather, ash cloud, dense air traffic and the like.

The safety-margins modeler 308 may also model measures of one or more conditions that affect safety margin. In some examples, these measures may be modeled in terms of other model variables. Examples of suitable conditions include climb rate, rate of fuel burn, braking force and the like.

The physiological-effects modeler 310 may be configured to develop a model of physiological effects. In some examples, physiological effects may be defined to include measures of one or more conditions that affect one's physiological or physical comfort or discomfort. Examples of suitable conditions include cabin pressure, temperature, light levels, cabin-visibility levels (e.g., smoke), breathability and the like.

The search-target encoder 312 may receive input from various ones of the modelers (e.g., failure-modes modeler 302, hazards modeler 304, crew-workload modeler 306, safety-margins modeler 308, physiological-effects modeler 310), and generate one or more search targets based on their respective models. Generally, search targets may be logical expressions or algorithms in propositional or temporal logic made up of model variables, counts, thresholds and the like, which may represent cumulative effects of a failure scenario that one desires to review. In some examples, a search target may formalize in an expression or algorithm, evaluation criteria that may be used to select failure scenarios that have sufficiently-significant cumulative effects to warrant further evaluation by subject matter experts (SMEs). It may enable the automatic discovery of single-failure and multiple-failure scenarios that match search target. This automation may reduce labor, and may be more systematic and/or effective when compared with other, more ad-hoc approaches.

More particularly, for example, a search target may be a logical expression or algorithm in propositional or temporal logic that combines representations or quantifications of hazards, crew workload, safety margins, physiological effects and the like for failure modes of the complex system. A search target may encode notable (or excessive) hazards, crew workload, loss of safety margins and/or physiological effects in the event of a failure scenario. In some examples, notable hazards may be defined as greater than a threshold count of complex-system-level and system-level hazards. The crew workload may be defined as greater than threshold count(s) of alert messages that may be generated for a failure scenario, and/or (pages of) compensatory actions (crew procedures, non-normal operating procedures), and/or a threshold time to complete compensatory actions, which may mark notable crew workload in the event of a failure scenario. Notable loss of safety margin may be defined as one or more operational factors and greater or less than threshold measures of condition(s) that affect safety margin. And notable physiological effects may be defined as greater or less than threshold measures of condition(s) that affect one's physiological/physical comfort/discomfort. In various examples, the expressions may include logical conjunctions (AND gates) and/or disjunctions (OR gates) of respective counts, thresholds and the like.

In some examples, threshold measures of condition(s) that affect safety margin may include an expected usage threshold such as minimum/maximum measures of expected usage (e.g., no reduction of safety margin), and an unsafe condition threshold such as minimum/maximum measures of an unsafe condition (e.g., unsafe condition causing catastrophic incident). The safety margin, then, may be considered the difference between the expected usage threshold and unsafe condition threshold.

In addition, in some examples, safety margin may include one or more intermediate thresholds that characterize partial loss of safety margin corresponding to different levels of severity (e.g., hazardous, major, minor). Quantitative measures may be associated with respective qualitative descriptions. For example, a large-reduction threshold may be associated with a (hazardous) condition that causes more than a significant reduction of safety margin, but does not cause a complete loss of safety margin. A significant-reduction threshold may be associated with a (major) condition where it is reasonably expected that safe flight and landing can occur, absent other failures and all but the most extreme adverse operating conditions. And a slight-reduction threshold may be associated with a (minor) condition that has more than no effect but less than a significant effect (e.g., as above for a significant reduction).

A search target may include complex-system-level and system-level hazards modeled by the hazards modeler 304, and their threshold count and severity for noteworthiness in the event of a failure scenario. Additionally or alternatively, the search target may include alert messages, (pages of) compensatory actions (crew procedures, non-normal operating procedures) and/or time to complete compensatory actions modeled by the crew-workload modeler 306, and their threshold count for noteworthiness in the event of the failure scenario. Additionally or alternatively, the search target may include safety margins modeled by the safety-margins modeler 308, and their threshold loss for noteworthiness in the event of the failure scenario. And further, additionally or alternatively, the search target may include conditions of physiological/physical comfort/discomfort modeled by the physiological-effects modeler 310, and their threshold measures in the event of the failure scenario.

In one example, a search target may be used to identify failure scenarios that cause multiple major hazards and excessive crew workload that occur during the landing phase of flight. In another example, a search target may be used to identify failure scenarios causing two or more "hazardous" failure conditions during any flight. In yet another example, a search target may be used to identify failure scenarios having more than three major failure conditions and less than three failure modes, and excessive crew workload or more than one physiological effect. In this example, the search target may be encoded as follows:

$$SearchTarget1 := major\_hazard\_count > 3 \ \& \ failure\_mode\_count < 3 \ \&$$
$$(excessive\_workload = True \ | \ physical\_effect > 1) \ \&$$

```
flight_phase = LANDING; ...
```

In one example, a search target may be used to identify failure scenarios in which a loss/degradation of thrust and gear retractability prevent the aircraft from attaining a sufficient rate of climb (condition affecting safety margin) during takeoff from a runway with obstacles near its end (operational factor). In another example, a search target may be used to identify failure scenarios in which a loss/degradation of brakes and directional control prevent the aircraft from generating sufficient total braking energy (condition affecting safety margin) to stop before the end of a short runway during landing (operational factor). And in yet another example, a search target may be used to identify failure scenarios in which a loss of cabin pressure or the combined loss/degradation of aero-surface control and fuel control prevent a twin-engine aircraft on a trans-oceanic route from reaching its nearest airport (operational factor), in which the condition affecting safety margin may include the ratio of remaining range to the distance from the nearest airport.

Figure 6:
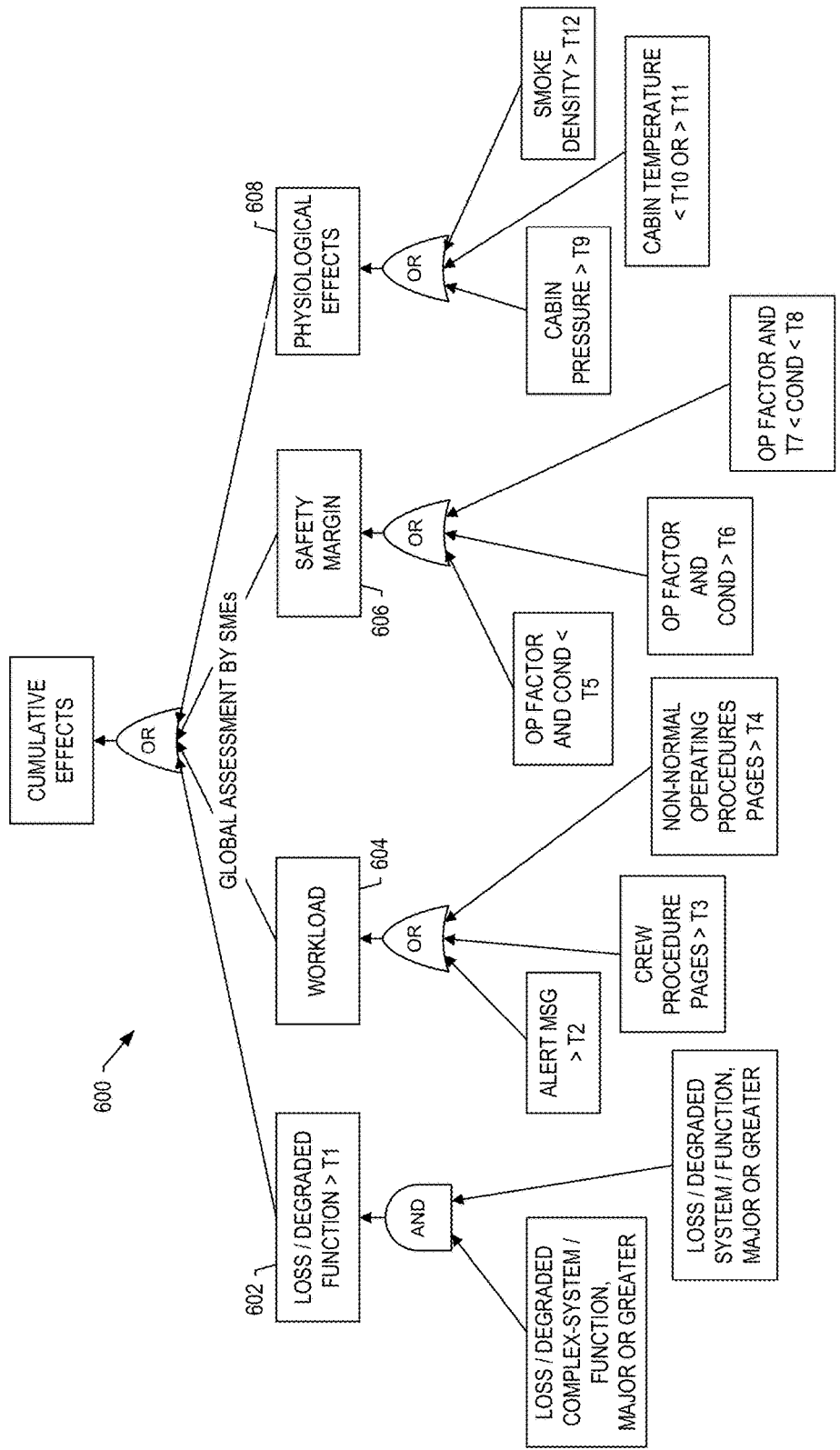
FIG. 6 illustrates an example graphical representation of a search target according to one example implementation.

FIG. 6 illustrates one example of a graphical representation of a suitable search target 600. As shown, the example search target includes nodes for hazards 602 (loss/degraded function), crew workload 604, safety margin 606 and physiological effects 608. This search target may be used to identify failure scenarios having greater than a first threshold (T1) count of complex-system-level and system-level hazards. Excessive workload in the search target may include the logical disjunction of greater than a second threshold (T2) count of alert messages, a third threshold (T3) count of crew procedure pages, and a fourth threshold (T4) count of non-normal operating procedure pages. Notable loss of safety margin may include the logical disjunction of operational factor(s) and a condition affecting safety margin less than a fifth threshold (T5), operational factor(s) and a condition affecting safety margin greater than a sixth threshold (T6), and operational factor(s) and a condition affecting safety margin between a seventh threshold (T7) and eighth threshold (T8). And notable physiological effects may include the logical disjunction of cabin pressure greater than a ninth threshold (T9), cabin temperature less than a tenth threshold (T10) or greater than an eleventh threshold (T11), and smoke density greater than a twelfth threshold (T12).

Notably, the logical expressions shown in FIG. 6 may not constitute the entire set of cases for the illustrated search target. In crew workload 604, for example, aural alerts give pilots urgent information which may require pilot response, increasing workload. In safety margin 606, for example, there may be many additional safety margins that are modeled in different manners and constitute other inputs to the logical disjunction expression. In physiological effects 608, for example, another effect may be loss of lighting, which could impact evacuation or reading paper documentation in the cockpit.

A search target may therefore combine multiple hazards or failures with other factors that contribute to cumulative effects, such as workload, safety margins, physiological effects and the like. There may be multiple search targets to cover different combinations of factors, such as number/severity of hazards/failures, workload, safety margins, physiological effects and the like. In some examples, multiple failures or other factors of a failure scenario may combine to elevate a complex-system-level severity over and above that of a single system-level hazard. For example, a dual failure that causes three "major" failures (as categorized individually in the aircraft or system FHA) may have a combined severity of "hazardous" or "catastrophic" when evaluated according to the guidelines of CFR 25.1309.

Figure 4:
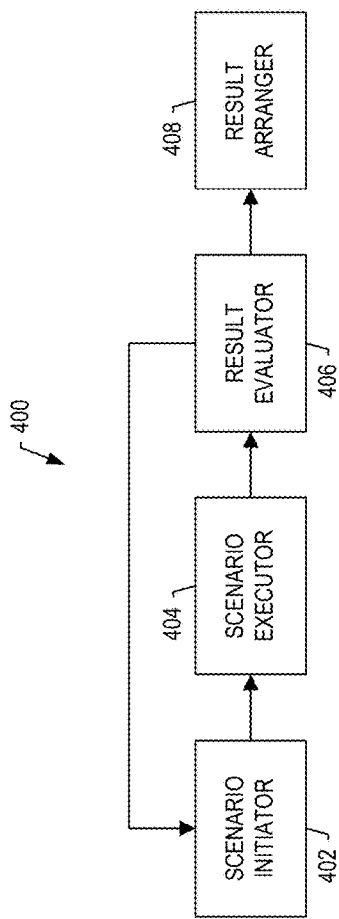

FIG. 4 illustrates a model analysis system 400, which in one example implementation may correspond to model analysis system 106. As suggested above, in some examples, the complex-system model may be extended to include the cumulative effects model, and thereby form an extended complex-system model. The model analysis system may include a scenario initiator 402 configured to initiate a failure scenario for analysis, which may include selection (e.g., user selection) of an extended complex-system model (including its failure modes), search targets, type of analysis and the like. In one example, the complex-system model may be one developed by a system modeler 102, and extended to include the cumulative effects model developed by an effects modeler 104. The search targets may likewise be ones developed by the effects modeler. And the type of analysis may be any of a number of different types of analysis that may be performed using the extended complex-system model and search targets.

The model analysis system 400 may include a scenario executor 404 configured to analyze the extended complex-system model based on the search targets, and according to the type of analysis selected at the scenario initiator 402. In some examples, the scenario executor may perform a graph search of possible states of the extended complex-system model to locate one or more search targets, and may do according to an appropriate analysis algorithm. The algorithm may be top-down or bottom-up. In some examples, the algorithm may traverse a state space (graph) of the extended complex-system model to determine if the search target is locatable. The algorithm may record a minimal cut set (MCS) in instances in which a reachable state intersects with the search target, and record a trace for each MCS.

Examples of suitable algorithms that the scenario executor 404 may use to determine if the search target can be reached include state space enumeration, symbolic state space enumeration, abstract interpretation, symbolic simulation, symbolic trajectory evaluation, symbolic execution and the like, various ones of which may have a variety of implementations. In the category of symbolic state space enumeration, for example, the analysis-scenario executor may use binary decision diagrams (BDDs), zero suppressed decision diagrams (ZDDs), bounded model checking, satisfiability (SAT) analysis, satisfiability modulo theories (SMT) analysis and the like. In some more particular examples, the scenario executor may use additional extensions to record counter-examples (violations), and produce MCS fault trees and failure modes and effects analysis (FMEA) summaries or other artifacts, such as for use in model-based safety analysis (MBSA).

The scenario executor 404 may produce and output results of the analysis to a result evaluator 406, which may be configured to review the results of the analysis, or in some examples, present the results to a user (e.g., analyst) to facilitate their review of the results. In some examples, the results may include fault trees, MCS fault trees, FMEA tables, FMEA Summaries, timing diagrams or equivalent data. A fault tree is a representation of the sequence of events leading to a failure condition, with the events being connected by logic (e.g., AND, OR) gates. A MCS fault tree is the smallest combination of events that may cause the failure condition. FMEA tables are representations of failure definitions and their local effects. A FMEA summary presents information about the initial failures and the overall resulting failure condition. A fault tree, MCS fault tree or FMEA summary may have appropriate timing diagram(s) that provide information about the sequence of operation that led to the failure condition. A timing diagram represents the values of variables in a model over time and shows the timing relationship between variables. The timing diagram may be reviewed by a stakeholder, or its triggering events may be input to a simulator to step through the sequence of operations to better understand the sequence of failures leading to the failure condition.

The model analysis system 400 may further include a result arranger 408 configured to arrange the results, such as by filtering, sorting, grouping or the like. For example, the result arranger may sort the results or truncate generation of MCSs (by the scenario executor 404) based on MCS probabilities, such as when the probability is less than a certain threshold. The result arranger may group results base on their similarity (e.g., duplicate/mirror image), and in one example, may use a list of redundant components to identify similarity. In another example, the result arranger may group failure scenarios with overlapping failure modes or overlapping failure conditions. In some examples, the result arranger may automatically arrange the results. Or in other examples, the result arranger may arrange the results in response to input from a user, such as the user reviewing the results presented by the analysis-result evaluator 406.

Figure 5:
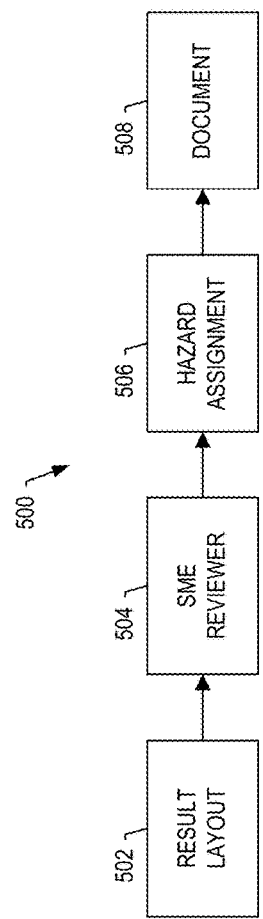

FIG. 5 illustrates an effects assessment system 500, which in one example implementation may correspond to effects assessment system 108. As shown, the effects assessment system may include a result layout system 502 (sometimes referred to as a data layout system), SME reviewer system 504, hazard assignment system 506 and/or documentation system 508. The result layout system may be configured to receive at least a portion of an extended complex-system model and results of a failure analysis performed thereon (collectively at times referred to as "failure analysis data"), such as by a model analysis system 106. In some examples, the failure analysis data may be maintained in a respective storage such as file storage, database storage, cloud storage or the like, and formatted and stored in any of a number of different manners according to the respective storage.

The result layout system 502 may generate any one or more of a plurality of different layouts of failure analysis data, with at least some of the failure analysis data being shared between at least some of the different layouts. In some more particular examples, the result layout system may post-process traces of MCSs to generate failure analysis data for the layout. The layout may be visually presented; and in one example, the visual presentation of a layout may be displayable such as in a graphical user interface (GUI) presented by a display. In another example, the visual presentation may be printable such as by a printer configured to generate a printout of the layout. The visual presentation of a layout may at times be generally referred to as simply the layout.

The result layout system 502 may be configured to select a layout model from a plurality of layout models for selecting and arranging failure analysis data. In one example, the layout engine may be configured to select the layout model according to a request for failure analysis data, which may indicate or otherwise reflect a particular layout model. The layout models may include any of a number of different types of layouts for arranging failure analysis data. As explained further below, examples of suitable layout models include a cascading effect layout model, flight deck layout model, flight profile layout model, functional impact layout model or the like. Other examples may include combinations of one or more of the foregoing layout models. The layout models may be maintained in a respective storage such as file storage, database storage, cloud storage or the like, and formatted and stored in any of a number of different manners according to the respective storage.

The result layout system 502 may be configured to generate a layout of failure analysis data, which may be arranged according to the selected layout model, and communicate the layout such as to a GUI, printer or the like. In some examples, the result layout system may dynamically generate the layout according to a selected layout model such that a different layout of the failure analysis data may be realized by changing the selected layout model. In one example, then, the result layout system may receive a request for a different arrangement of failure analysis data, select a different layout model, and generate a different layout of failure analysis data, in response to the request. This may include the analysis-result layout system being configured to rearrange failure analysis data according to the selected different layout model.

The SME reviewer system 504 may be configured to present various aspects of an analyzed failure scenario such as its extended complex-system model and search targets, results of the failure analysis, and/or layouts of failure analysis data including at least a portion of the respective model and results. The SME reviewer system may present aspects of the analyzed failure scenario to one or more users to facilitate their review of the failure scenario and its cumulative effects. These users may include, for example, a team of stakeholders of the complex system such as systems engineers, authorized representatives (ARs), safety engineers, individual system subject matter experts (SMEs), pilots and the like.

The hazard assignment system 506 may be configured to receive assignment of a complex-system-level severity to the complex-system-level failure described by the analyzed failure scenario, based on the review of aspects of the analyzed failure scenario; and the hazard assignment system may also capture a rationale for the assignment. In various examples, the assignment and its rationale may be made by one or more users (e.g., team of stakeholders) according to accepted principles.

The documentation system 508, then, may be configured to assemble the analyzed failure scenario and its assigned severity and rationale. As suggested above, the analyzed failure scenario may include, for example, its extended complex-system model and search targets, results of the failure analysis, and/or layouts of failure analysis data, and further including its assigned severity and rationale. In some examples, the documentation system may assemble the foregoing for storage such as file storage, database storage, cloud storage or the like, and may format and store the foregoing in any of a number of different manners according to the respective storage.

Returning now to the result layout system 502, as explained above, the result layout system may generate a layout of failure analysis data according to a number of different layout models. And the layout models may include any of a number of different types of layouts for arranging failure analysis data. Reference will now be made to FIGS. 7-10, which schematically illustrate examples of suitable layout models in the context of an aircraft. As shown, these examples include a cascading effect layout, flight deck layout, flight profile layout, functional impact layout or the like.

Figure 7:
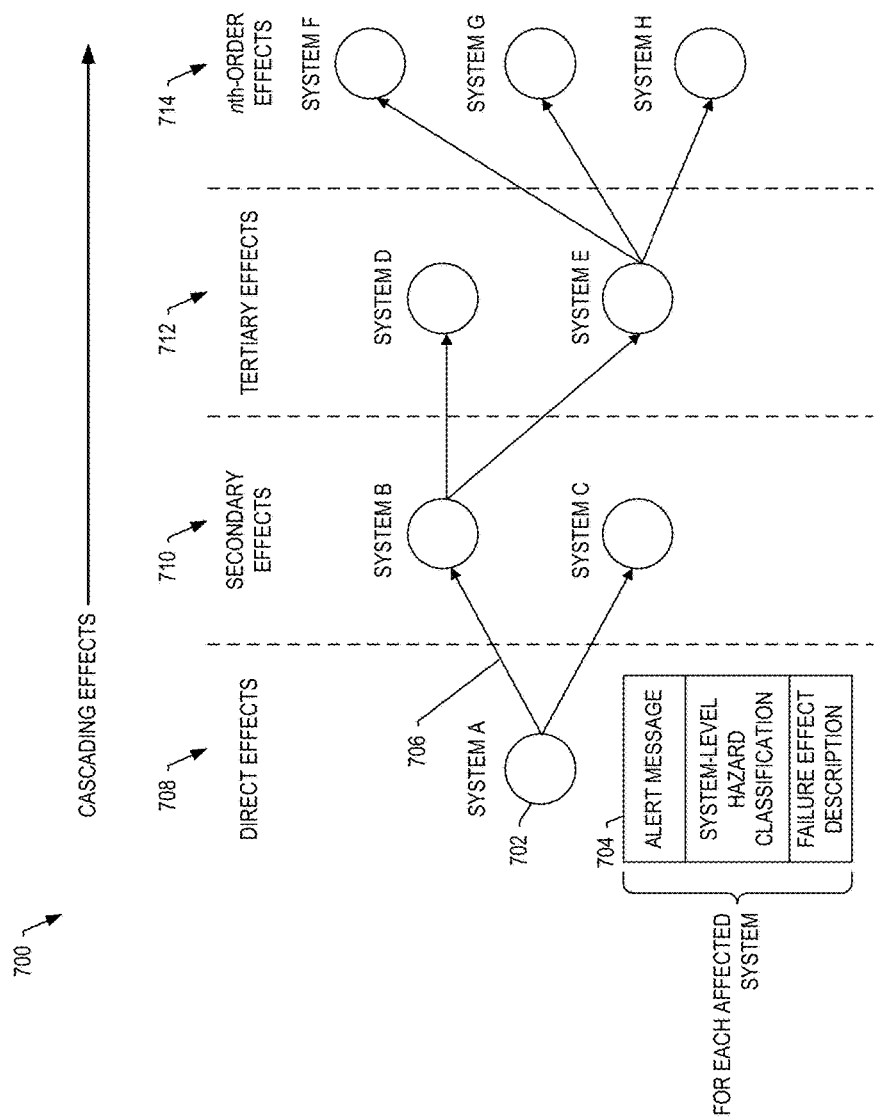

FIG. 7 illustrates a cascading effect layout model 700 according to one example implementation. The cascading effect layout model generally provides a graphical representation of cascading failure effects including one or more direct effects, and in various instances, one or more indirect effects. As explained above, a direct effect may be any primary (or originating) effect resulting directly from an originating system-level failure. An indirect effect may be any secondary (or second-order) effect, tertiary (or third-order) effect, quaternary (or fourth-order) effect and so up to a complex-system-level effect) on resulting indirectly from an originating system-level failure, and directly from a direct effect or from another indirect effect. This layout model may be of particular interest to understand the reasons behind the effects and the impacts across systems of the complex system. This layout model may be useful to a number of different stakeholders of the complex system such as systems engineers, ARs, safety engineers, individual system SMEs, pilots or the like.

As shown in FIG. 7, in the cascading effect layout model 700 for a failure scenario (or case), each system of the complex system may be represented as a node 702 and include respective failure data 704 such as one or more alert messages, system-level hazard level and/or additional effect description (only one node being called out and shown respective failure data in FIG. 7). The cascading effect layout model may also illustrate linkages 706 (only one linkage being called out) between the nodes 702, which may illustrate how a failure of one system of the complex system may directly or indirectly result in failure of one or more other systems of the complex system. In one example, these linkages may be presented to illustrate cascading effects of a system failure. In this regard, the cascading effect layout model may identify an originating failed system, and which may experience one or more direct effects of the failure. The originating failed system may in turn be directly or indirectly linked to one or more higher-order failed systems that may experience respective one or more indirect, higher-order effects. For example, the originating failed system may be directly linked to one or more secondary failed systems that may experience respective one or more secondary effects. The respective secondary failed system(s) may in turn be linked to one or more tertiary failed systems of the complex system that may experience respective one or more tertiary effects. For the complex system, this may occur for n-orders of systems removed from the originating failed system.

In one example, the nodes 702 of the cascading effect layout model 700 may be arranged by the order of their effects. The originating failed system may be organized according to its experiencing the direct effects 708. This originating failed system may then be linked to one or more secondary failed systems organized according to their experiencing the secondary effects 710, and which may be linked to one or more tertiary failed systems organized according to their experiencing the tertiary effects 712. This linkage may then continue to one or more higher-order failed systems organized according to their experiencing the nth-order effects 714. It should be understood that although the cascading effect layout model of FIG. 7 appears to indicate at least two orders of effects resulting from an originating failure, fewer than two orders of effects may result from an originating failure (including an originating failure with only direct effects).

Figure 8:
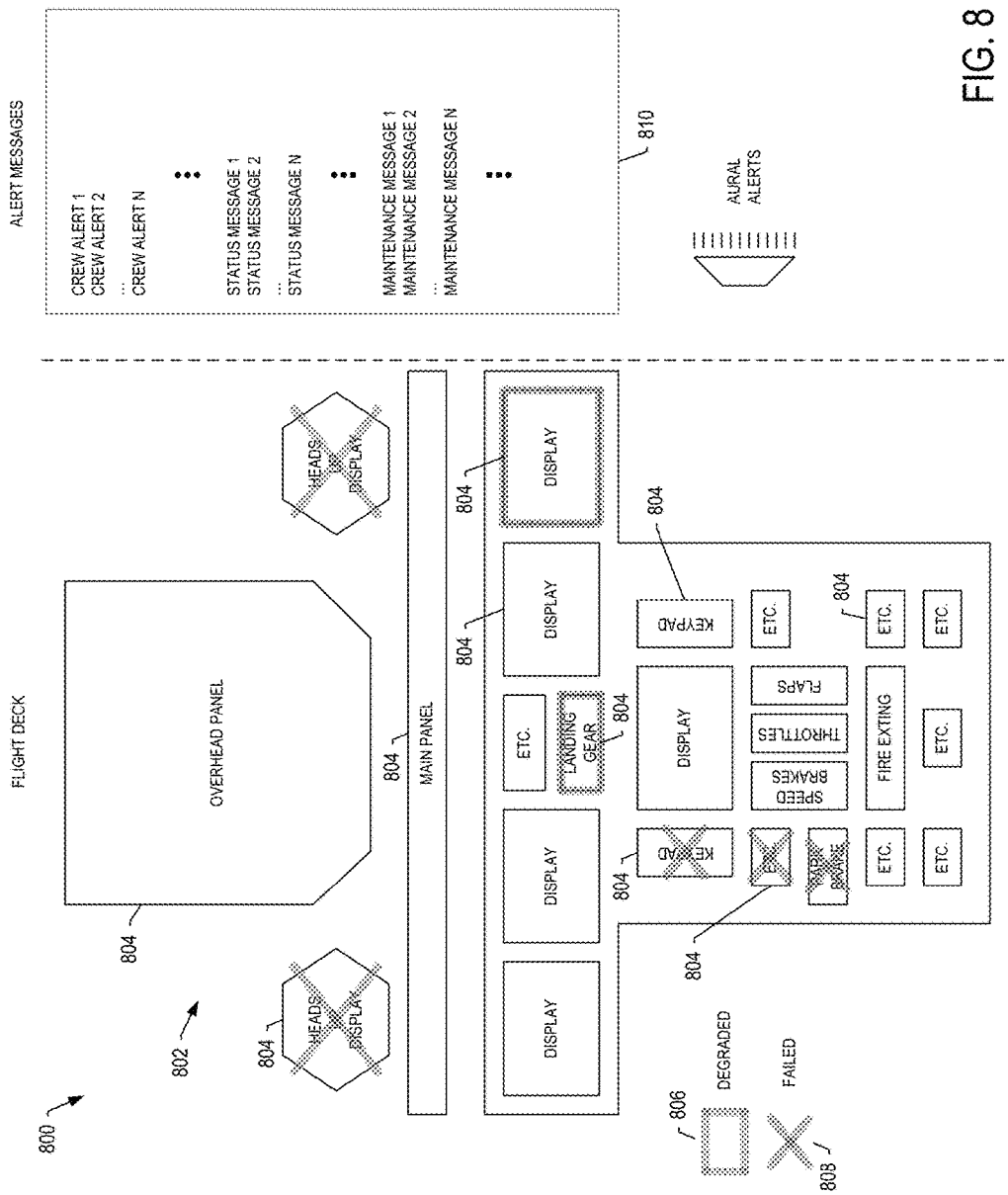

FIG. 8 illustrates a flight deck layout model 800 according to one example implementation. The flight deck layout model generally provides a graphical representation of cascading failure effects that may be experienced by one or more flight deck systems. The flight deck layout model may be of particular interest to understand how a particular failure may appear to crew of an aircraft or other similar complex system. This information may be useful to stakeholders such as systems engineers, ARs, safety engineers, system SMEs, pilots and the like.

As shown in FIG. 8, the flight deck layout model 800 may include a schematic representation of a flight deck 802 in which various ones of its systems may be illustrated by respective schematic representations 804 (some but not all of which are called out in FIG. 8). In one example, the flight deck and its systems may be schematically represented in a manner that reflects placement of the systems (or more particularly in one example their controls) that may be visible to crew in the flight deck. In one example, this schematic representation may be generated from design data for the flight deck.

For a failure scenario, then, the flight deck layout model 800 may identify one or more failed systems including originating and/or higher-order failed systems, and may do so directly on their respective schematic representations 804. In one example, the flight deck layout model may textually, graphically or otherwise highlight the schematic representations of one or more failed systems. In a further example, the flight deck layout model may highlight one or more failed systems in a manner that reflects additional failure data such as the functional states (or failure modes) of the failed systems. As shown in FIG. 8, for example, the flight deck layout model may outline 806 representations of failed systems having a "degraded" state, and cross through 808 representations of failed systems having a "failed" state.

In addition to the foregoing, the flight deck layout model 800 may include additional failure data for failed systems in the flight deck. In one example, this additional failure data may include for at least some of the failed systems, one or more alert messages 810 and/or compensatory actions that may have been generated or taken in response to a failure. Additionally or alternatively, for example, the additional failure data may include system-level hazard level and/or additional effect description for at least some of the failed systems.

Figure 9:
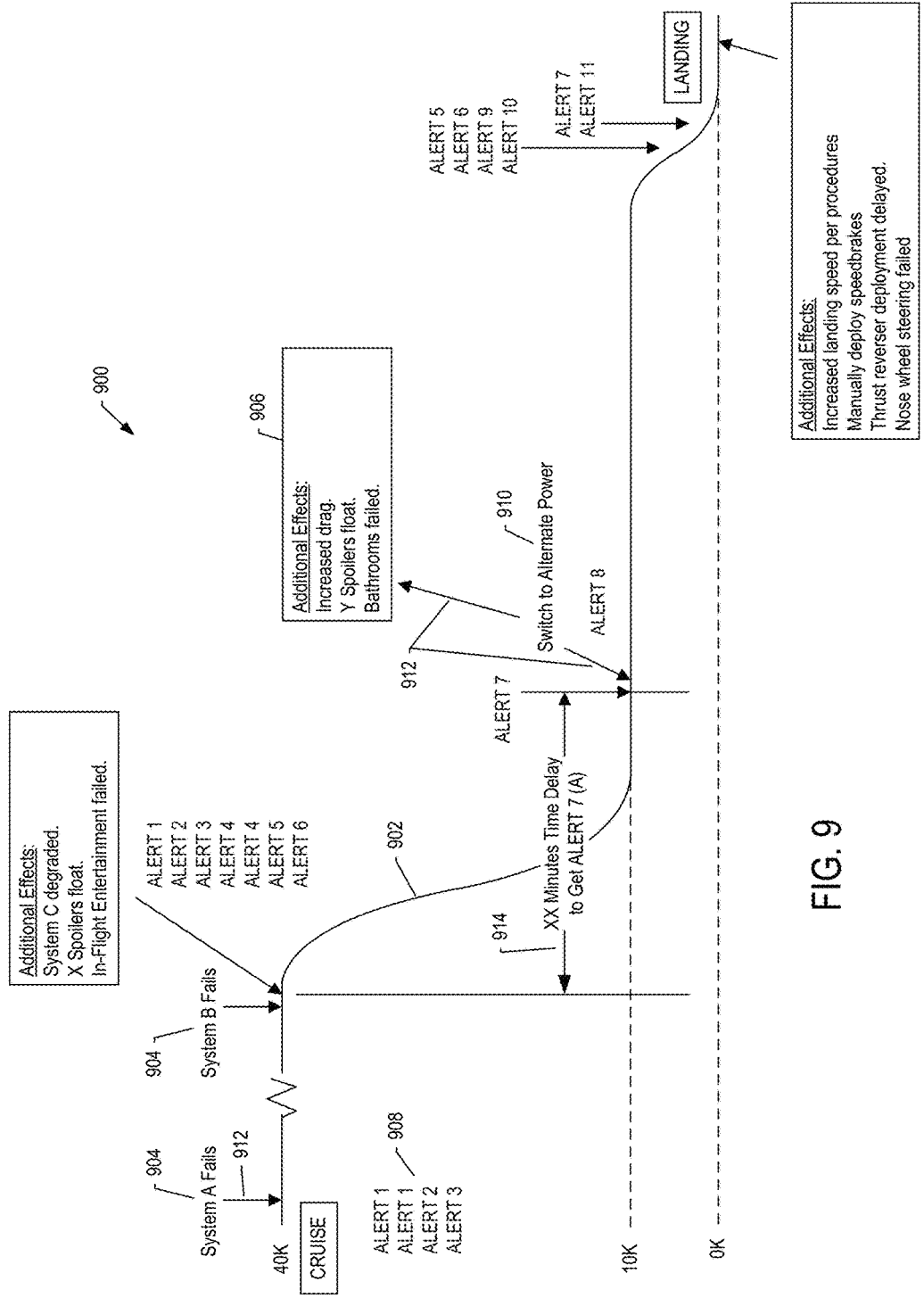

FIG. 9 illustrates a flight profile layout model 900 according to one example implementation. The flight profile layout model generally provides a graphical representation of cascading failure effects on a notional flight profile. This layout model may differ from the other "flat" layouts in that it provides a time-phased/flight-phased view of a failure scenario. Not all system failures occur at the same time. There may be time delays in cascading failures. For example, the loss of cooling may lead to failures in systems that may be degraded or failed above a certain temperature, but it may take time for the system once cooled to increase above the respective temperature. This information may be useful to stakeholders such as systems engineers, ARs, safety engineers, system SMEs, pilots or the like.

As shown in FIG. 9, the flight profile layout model 900 may include a graphical representation of a flight profile 902 for a flight of the aircraft, which in one example may appear similar to a line chart of aircraft altitude versus time. The flight profile layout model may then include a timeline of one or more failure scenarios occurring during the flight, and may do so on the flight profile. In one example, the flight profile layout model may include failure data such as identification of one or more originating or higher-order failures 904, and/or one or more additional effect descriptions 906, alert messages 908 and/or compensatory actions 910 (some but not all of which are called out in FIG. 9).

At least some of the failure data of the flight profile layout model 900 may be associated with time (through identified flight phase). The flight profile layout model may therefore include linkages 912 between failure data and times on the flight profile (shown for one example as an arrowed linkage) (some but not all of the linkages being called out). For example, an originating or higher-order failure 904 may be associated with the time in which the failure occurred, and additional effects 906 of a failure may be associated with the time in which those effects are experienced. In another example, an alert message 908 may be associated with the time in which a system generated the respective message, and a compensatory action 910 may be associated with the time at which the crew took the respective action. In one example, the flight profile layout model may further indicate a time delay 914 between a failure and failure data that may be generated or taken in response to the failure.

FIG. 10 illustrates a functional impact layout model 1000 according to one example implementation. The functional impact layout model generally provides a tabular representation summarizing individual system-level effects and their impacts to the complex-system-level functions. This layout model may be unique from the other layout models in that it provides engineers a way to evaluate the overall effect of degradations to each complex-system-level function. This information may be useful to stakeholders such as systems engineers, ARs, safety engineers, system SMEs, pilots or the like.

As shown in FIG. 10, the functional impact layout model 1000 may include a table having one or more rows (or records) 1002 for a respective one or more failure scenarios, and one or more columns (or fields) 1004 specifying information regarding the respective failure scenario(s). For each failure scenario in a row, the columns may identify a failure and/or one or more effects or higher-order failures manifested thereby, and may identify or otherwise summarize complex-system-level functions impacted by the respective failure and/or higher-order failures. In one example, for each failure scenario, one of the columns may further provide a summary of the combined effect of degradation of all sub-system-level functions and their effect on the overall system-level safety.

According to example implementations of the present disclosure, the failure-effect validation system 100 and it subsystems including the system modeler 102, effects modeler 104, model analysis system 106 and effects assessment system 108 may be implemented by various means. Similarly, the examples of a system modeler 200, effects modeler 300, model analysis system 400 and effects assessment system 500, including each of their respective elements, may be implemented by various means according to example implementations. Means for implementing the systems, subsystems and their respective elements may include hardware, alone or under direction of one or more computer program code instructions, program instructions or executable computer-readable program code instructions (at times generally referred to as "computer programs," e.g., software, firmware, etc.) from a computer-readable storage medium.

In some examples, the systems, subsystems or their respective elements may benefit from commercially-available computer programs. For example, the failure-effect validation system 100 may benefit from IBM Rational DOORS (Dynamic Object Oriented Requirements System) for receiving various requirements of the complex-system (and its various systems) to be modeled. The system modeler 102, effects modeler 104 and/or their various elements may benefit from various modeling tools such as Simulink®, Stateflow® or the like. The respective modelers and/or their various elements may develop or facilitate development of various models according to appropriate languages such as SysML (Systems Modeling Language), AADL (Architecture Analysis & Design Language) or the like. And the model analysis system 106 may benefit from various analysis tools such as NuSMV3, Cecilia OCAS or the like.

In one example, one or more apparatuses may be provided that are configured to function as or otherwise implement the systems, subsystems and respective elements shown and described herein. In examples involving more than one apparatus, the respective apparatuses may be connected to or otherwise in communication with one another in a number of different manners, such as directly or indirectly via a wireline or wireless network or the like.

Generally, an apparatus of exemplary implementations of the present disclosure may comprise, include or be embodied in one or more fixed or portable electronic devices. Examples of suitable electronic devices include a smartphone, tablet computer, laptop computer, desktop computer, workstation computer, server computer or the like. The apparatus may include one or more of each of a number of components such as, for example, a processor (e.g., processor unit) connected to a memory (e.g., storage device).

The processor is generally any piece of computer hardware that is capable of processing information such as, for example, data, computer programs and/or other suitable electronic information. The processor is composed of a collection of electronic circuits some of which may be packaged as an integrated circuit or multiple interconnected integrated circuits (an integrated circuit at times more commonly referred to as a "chip"). The processor may be configured to execute computer programs, which may be stored onboard the processor or otherwise stored in the memory (of the same or another apparatus).

The processor may be a number of processors, a multi-processor core or some other type of processor, depending on the particular implementation. Further, the processor may be implemented using a number of heterogeneous processor systems in which a main processor is present with one or more secondary processors on a single chip. As another illustrative example, the processor may be a symmetric multi-processor system containing multiple processors of the same type. In yet another example, the processor may be embodied as or otherwise include one or more application-specific integrated circuits (ASICs), field-programmable gate arrays (FPGAs) or the like. Thus, although the processor may be capable of executing a computer program to perform one or more functions, the processor of various examples may be capable of performing one or more functions without the aid of a computer program.

The memory is generally any piece of computer hardware that is capable of storing information such as, for example, data, computer programs and/or other suitable information either on a temporary basis and/or a permanent basis. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk-read only memory (CD-ROM), compact disk-read/write (CD-R/W), DVD or the like. In various instances, the memory may be referred to as a computer-readable storage medium which, as a non-transitory device capable of storing information, may be distinguishable from computer-readable transmission media such as electronic transitory signals capable of carrying information from one location to another. Computer-readable medium as described herein may generally refer to a computer-readable storage medium or computer-readable transmission medium.

In addition to the memory, the processor may also be connected to one or more interfaces for displaying, transmitting and/or receiving information. The interfaces may include a communications interface (e.g., communications unit) and/or one or more user interfaces. The communications interface may be configured to transmit and/or receive information, such as to and/or from other apparatus(es), network(s) or the like. The communications interface may be configured to transmit and/or receive information by physical (wireline) and/or wireless communications links. Examples of suitable communication interfaces include a network interface controller (NIC), wireless NIC (WNIC) or the like.

The user interfaces may include a display and/or one or more user input interfaces (e.g., input/output unit). The display may be configured to present or otherwise display information to a user, suitable examples of which include a liquid crystal display (LCD), light-emitting diode display (LED), plasma display panel (PDP) or the like. The user input interfaces may be wireline or wireless, and may be configured to receive information from a user into the apparatus, such as for processing, storage and/or display. Suitable examples of user input interfaces include a microphone, image or video capture device, keyboard or keypad, joystick, touch-sensitive surface (separate from or integrated into a touchscreen), biometric sensor or the like. The user interfaces may further include one or more interfaces for communicating with peripherals such as printers, scanners or the like.

As indicated above, program code instructions may be stored in memory, and executed by a processor, to implement functions of the systems, subsystems and their respective elements described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that can direct a computer, a processor or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processor or other programmable apparatus to configure the computer, processor or other programmable apparatus to execute operations to be performed on or by the computer, processor or other programmable apparatus.

Retrieval, loading and execution of the program code instructions may be performed sequentially such that one instruction is retrieved, loaded and executed at a time. In some example implementations, retrieval, loading and/or execution may be performed in parallel such that multiple instructions are retrieved, loaded, and/or executed together. Execution of the program code instructions may produce a computer-implemented process such that the instructions executed by the computer, processor or other programmable apparatus provide operations for implementing functions described herein.

Execution of instructions by a processor, or storage of instructions in a computer-readable storage medium, supports combinations of operations for performing the specified functions. It will also be understood that one or more functions, and combinations of functions, may be implemented by special purpose hardware-based computer systems and/or processors which perform the specified functions, or combinations of special purpose hardware and program code instructions.

Many modifications and other implementations of the disclosure set forth herein will come to mind to one skilled in the art to which these disclosure pertain having the benefit of the teachings presented in the foregoing descriptions and the associated drawings. Therefore, it is to be understood that the disclosure are not to be limited to the specific implementations disclosed and that modifications and other implementations are intended to be included within the scope of the appended claims. Moreover, although the foregoing descriptions and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:
1. A method comprising:
designing and thereby producing a design of an aircraft, including at least:
developing a model of the aircraft, including models of aspects of the aircraft of which the model of the aircraft is composed, including models of an architecture of the aircraft, one or more operating modes of the aircraft, and behaviors or interactions of systems of the aircraft;
developing a cumulative effects model for failure modes of the aircraft, and by which the model of the aircraft is extendible to form an extended model;
developing one or more search targets each of which includes logical expressions of notable hazards and one or more of crew workload, safety margin or physiological effects, each of the one or more search targets producing a respective combination of representations of the notable hazards and one or more of the crew workload, the safety margin or the physiological effects for the failure modes of the aircraft;
performing an automated analysis including a graph search of possible states of the extended model to locate one or more search targets, the automated analysis being performed to identify cumulative effects of at least some of the failure modes to generate failure analysis data;
selecting a layout model from a plurality of layout models according to a request for the failure analysis data, each of the plurality of layout models representing a respective arrangement of the failure analysis data;

dynamically generating a layout of the failure analysis data in which results of the automated analysis are displayable to enable an assessment of the cumulative effects, according to the selected layout model; and accommodating the assessment of the cumulative effects in the design of the aircraft; and manufacturing the aircraft according to the design of the aircraft with the assessment of the cumulative effects accommodated therein.

2. The method of claim 1, wherein developing the cumulative effects model includes developing a hazards model of complex-system-level and system-level hazards, and wherein developing one or more search targets includes developing one or more search targets in which notable hazards are defined as greater than a threshold count of complex-system-level and system-level hazards.

3. The method of claim 2, wherein each of the one or more search targets includes logical expressions of notable hazards, crew workload and physiological effects, wherein developing the cumulative effects model further includes:

developing a model of crew workload in which crew workload is defined to include one or more of a count of alert messages, a count of compensatory actions or pages of compensatory actions, or a time to complete compensatory actions; and developing a model of physiological effects in which physiological effects are defined to include measures of one or more conditions that affect physiological or physical comfort or discomfort, and wherein developing one or more search targets includes developing one or more search targets further in which notable crew workload is defined as greater than a threshold count of alert messages, a threshold count of compensatory actions or pages of compensatory actions, or a threshold time to complete compensatory actions, and in which notable physiological effects are defined as greater or less than threshold measures of the one or more conditions.

4. The method of claim 1, wherein each of the one or more search targets includes logical expressions of notable hazards and crew workload, wherein developing the cumulative effects model includes developing a model of crew workload in which crew workload is defined to include one or more of a count of alert messages, a count of compensatory actions or pages of compensatory actions, or a time to complete compensatory actions, and wherein developing one or more search targets includes developing one or more search targets in which notable crew workload is defined as greater than a threshold count of alert messages, a threshold count of compensatory actions or pages of compensatory actions, or a threshold time to complete compensatory actions.

5. The method of claim 4, wherein the compensatory actions include crew procedures and non-normal operating procedures, wherein developing the model of crew workload includes developing the model of crew workload in which crew workload is defined to include counts of respective ones of alert messages, crew procedures or pages of crew procedures, and non-normal operating procedures or pages of non-normal operating procedures, and wherein developing one or more search targets includes developing one or more search targets in which notable crew workload is defined as the logical disjunction of greater than threshold counts of respective ones of alert messages, crew procedures or pages of crew procedures, and non-normal operating procedures or pages of non-normal operating procedures.

6. The method of claim 1, wherein each of the one or more search targets includes logical expressions of notable hazards and safety margin, wherein developing the cumulative effects model includes developing a model of safety margins in which safety margin is defined to include one or more operational factors and measures of one or more conditions that affect safety margin; and wherein developing one or more search targets includes developing one or more search targets in which notable loss of safety margin is defined as greater or less than threshold measures of the one or more conditions.

7. The method of claim 1, wherein each of the one or more search targets includes logical expressions of notable hazards and physiological effects, wherein developing the cumulative effects model includes developing a model of physiological effects in which physiological effects are defined to include measures of one or more conditions that affect physiological or physical comfort or discomfort, and wherein developing one or more search targets includes developing one or more search targets in which notable physiological effects are defined as greater or less than threshold measures of the one or more conditions.

8. The method of claim 7, wherein the one or more conditions include a plurality of conditions including two or more of cabin pressure, temperature, light levels, cabin-visibility levels or breathability, wherein developing the model of physiological effects includes developing the model of physiological effects in which physiological effects is defined to include measures of respective ones of the plurality of conditions, and wherein developing one or more search targets includes developing one or more search targets in which notable physiological effects are defined as the logical disjunction of greater or less than threshold measures of respective ones of the plurality of conditions.

* * * * *